(12) United States Patent
Gilb et al.

(10) Patent No.: US 10,143,118 B2
(45) Date of Patent: Nov. 27, 2018

(54) ARRANGEMENT FOR PROTECTING ELECTRONICS FROM INTERFERENCE RADIATION

(71) Applicants: Continental Teves AG & Co. oHG, Frankfurt (DE); Conti Temic microelectronic GmbH, Nürnberg (DE)

(72) Inventors: Jürgen Gilb, Wehrheim (DE); Michael Jürgens, Wölfersheim (DE); Erwin Kreitmeyr, Hohenwart/Koppenbach (DE); Ralf Weyrich, Weinsheim (DE)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 0 days.

(21) Appl. No.: 15/806,797

(22) Filed: Nov. 8, 2017

(65) Prior Publication Data

US 2018/0132389 A1   May 10, 2018

Related U.S. Application Data

(63) Continuation of application No. PCT/EP2016/060521, filed on May 11, 2016.

(51) Int. Cl.
*H05K 9/00* (2006.01)
*H05K 5/00* (2006.01)
*H05K 5/06* (2006.01)

(52) U.S. Cl.
CPC .......... *H05K 9/0041* (2013.01); *H05K 5/064* (2013.01); *H05K 5/068* (2013.01); *H05K 9/0067* (2013.01)

(58) Field of Classification Search
None
See application file for complete search history.

(56) References Cited

U.S. PATENT DOCUMENTS

| 5,563,004 | A | * | 10/1996 | Buzzelli | H01M 2/1264 |
| | | | | | 429/405 |
| 5,698,818 | A | | 12/1997 | Brench | |
| 6,539,819 | B1 | * | 4/2003 | Dreyer | G01D 11/24 |
| | | | | | 73/431 |

(Continued)

FOREIGN PATENT DOCUMENTS

WO   WO2012113895 A2   8/2012

OTHER PUBLICATIONS

International Search Report and Written Opinion dated Oct. 4, 2016 from corresponding International Patent Application No. PCT/EP2016/060521.

(Continued)

*Primary Examiner* — Xanthia C Cunningham

(57) ABSTRACT

In one exemplary embodiment, an arrangement for protecting electronics from interference radiation includes a housing and a circuit carrier for accommodating the electronics in an interior of the housing. The housing defines an opening for compensating the different pressures inside and outside the housing. The arrangement of the exemplary embodiment is also distinguished by a contact-making element of an electronic component of the electronics arranged between the opening and the circuit carrier in such a manner that the electronics are at least partially screened from interference radiation entering the housing through the opening.

7 Claims, 2 Drawing Sheets

(56) References Cited

U.S. PATENT DOCUMENTS

| | | | | |
|---|---|---|---|---|
| 6,839,214 B2* | 1/2005 | Berberich | ......... | H01R 13/6625 |
| | | | | 361/112 |
| 7,102,078 B2* | 9/2006 | Weber | ................. | G01D 11/245 |
| | | | | 174/50 |
| 7,614,148 B2* | 11/2009 | Chamberlain | ........... | G01V 1/16 |
| | | | | 174/37 |
| 7,616,448 B2* | 11/2009 | Degenkolb | ............ | H05K 3/284 |
| | | | | 174/50.5 |
| 9,023,539 B2* | 5/2015 | Chen Wang | ............ | H01M 4/06 |
| | | | | 429/405 |
| 2007/0147008 A1 | 6/2007 | Mongia | | |
| 2007/0217179 A1* | 9/2007 | Schoen | ................. | B29C 70/72 |
| | | | | 361/837 |
| 2008/0123259 A1* | 5/2008 | Moser | ................. | G01F 15/006 |
| | | | | 361/679.21 |
| 2010/0013496 A1* | 1/2010 | Goetz | ..................... | H02H 3/04 |
| | | | | 324/555 |
| 2010/0133896 A1* | 6/2010 | Iyatani | ................... | B60T 8/368 |
| | | | | 303/20 |
| 2010/0173206 A1* | 7/2010 | Wang Chen | ......... | H01M 8/028 |
| | | | | 429/400 |
| 2012/0178291 A1* | 7/2012 | Matsumoto | ........ | H01R 13/5219 |
| | | | | 439/588 |
| 2013/0285774 A1* | 10/2013 | Hasegawa | ................ | H01H 3/28 |
| | | | | 335/189 |
| 2015/0128715 A1* | 5/2015 | Kamimura | .......... | G01L 19/0084 |
| | | | | 73/754 |
| 2015/0340816 A1* | 11/2015 | Abe | ................... | H01R 13/6582 |
| | | | | 439/607.34 |

OTHER PUBLICATIONS

German Search Report dated Jan. 15, 2016 for corresponding German Patent Application No. 10 2015 209 468.5.

\* cited by examiner

ARRANGEMENT FOR PROTECTING ELECTRONICS FROM INTERFERENCE RADIATION

CROSS REFERENCE TO RELATED APPLICATION

This application claims the benefit of International application No. PCT/EP2016/058173, filed Apr. 14, 2016, which claims priority to German application No. 10 2015 208 573.2, filed May 8, 2015, each of which is hereby incorporated by reference.

TECHNICAL FIELD

The technical field relates to an arrangement for protecting electronics from interference radiation.

BACKGROUND

Electronic devices are often exposed to a wide variety of ambient conditions. For protection, these devices are frequently provided with pressure-equalizing openings which, for example, reduce pressure variations caused by with differences in temperature between the interior and exterior of a housing and reduce condensation. These openings can negatively impact the service life and reliability of electronics, and upon the leak-tightness of the housing. In a manner which is known per se, the pressure-equalizing openings may be provided with covering membranes, in order to prevent an ingress of humidity into the housing.

In many cases, it is also necessary for electronic control devices to fulfil requirements for electromagnetic compatibility, such that no disruptive effects, damage or destruction of electronic components occurs. Because of the openings in the housing at this location, pressure-equalizing openings are a particularly susceptible region to the penetration of electrical and/or magnetic interference radiation. In International patent publication No WO 2012/113895 A2, a housing is described which, for the protection of an electric or electronic circuit against physical or electrostatic damage, and for the evacuation of heat generated by the electric or electronic circuit, includes a partition configured as a sandwich structure of two end plates, with interlocking U-profiles for the formation of ventilation openings. By this arrangement, thermal requirements, and requirements with respect to electromagnetic compatibility can be fulfilled, despite the presence of openings. A disadvantage of this solution, however, is the complexity of the sandwich structure, and the associated higher production costs.

As such, it is desirable to present an arrangement for protecting electronics from interference radiation, which can be manufactured in the most cost-effective manner possible.

BRIEF SUMMARY

According to one exemplary embodiment, an arrangement for protecting electronics from interference radiation includes a housing and a circuit carrier for accommodating the electronics in an interior of the housing. The housing includes an opening for the compensation of different pressures inside and outside the housing. The arrangement also includes a contact-making element of an electronic component of the electronics arranged between the opening and the circuit carrier in such a manner that the electronics are at last partially screened from interference radiation entering the housing through the opening. In other words, interference radiation entering through the opening in the housing can be diverted by means of the contact-making element. A pressure-equalizing opening, for example, can thus be positioned in the region of ESD-sensitive electronics. The terms "electric" and "electronic", and any related expressions, are employed synonymously in the context of the present description. An electronic component can be a discrete component or a unit which can, but is not necessarily required to, form the basis of a common function. The interior of the housing is understood as the space which accommodates the electronics.

According to another exemplary embodiment, the electronic component is connected to the circuit carrier in an electrically-conductive manner by the contact-making element, wherein the electronic component is a functional constituent of a load current circuit for the control of a load. At least one electronic component which would be present in any case can thus be employed in an advantageous manner for the shielding of ESD-sensitive electronics from interference radiation. The load may be an electric motor, for example a pump motor of a brake control unit in a vehicle.

Appropriately, the electronic component may be an interference-suppression component. Interference-suppression components are designed for the filtering, e.g., of high-frequency alternating current fractions, and consequently are not ESD-sensitive components, such that these components can be particularly advantageously employed for the screening function.

According to an advantageous further development, the contact-making element and/or an arrangement of the contact-making element relative to the opening are configured such that, in consideration of a configuration of the opening and/or of an available installation space in the interior of the housing, a lowest possible level of interference radiation is present on the circuit carrier.

The housing may incorporate a molding which at least partially encloses the opening for the screening of interference radiation. Consequently, an additional screening of electronics, or of electronic components, which are arranged on the circuit carrier, is achieved in the region of the opening. The molding may be arranged in the interior of the housing.

The molding may at least partially surround the opening in a circular arrangement. This is particularly advantageous if the opening is also circular.

According to an advantageous form of embodiment, the molding incorporates an open region for the feedthrough of the contact-making element. This advantageously permits a space-saving design, as it is not necessary for the contact-making element to be routed upwards in order to cross the molding.

BRIEF DESCRIPTION OF THE DRAWINGS

Further forms of embodiment proceed from the following description of an exemplary embodiment, with reference to the figures.

In a schematic representation.

DETAILED DESCRIPTION

Figure 1:
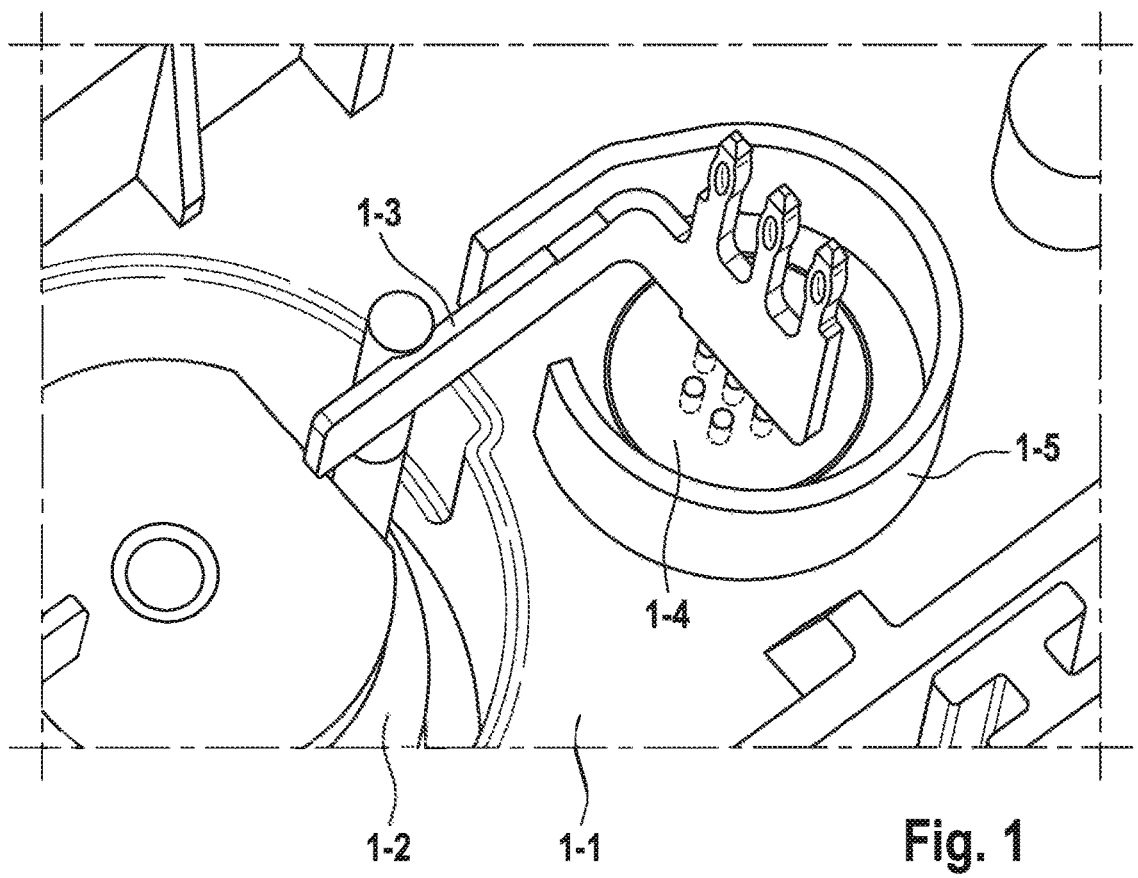
FIG. 1 shows an exemplary embodiment of the arrangement, with an exemplary pressure-equalizing opening and a reactance coil.
Figure 2:
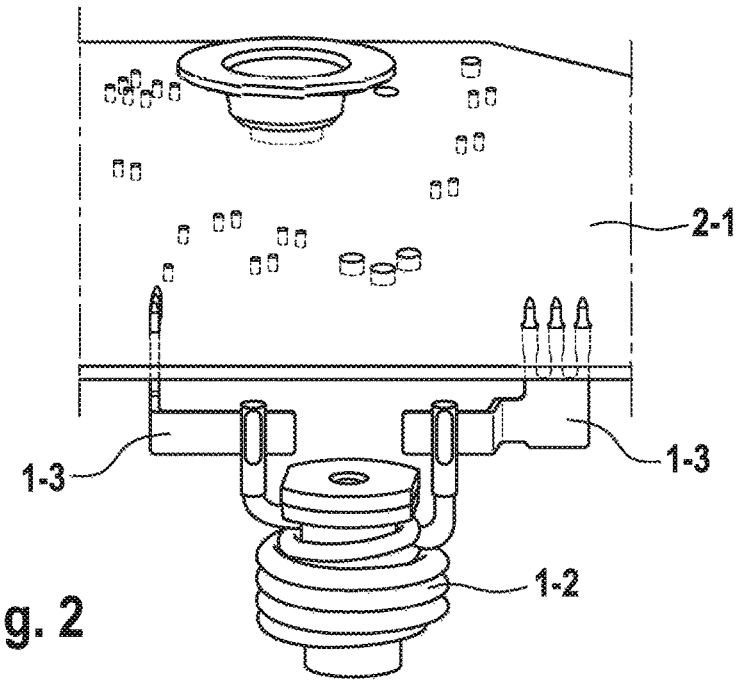
FIG. 2 shows an exemplary contact arrangement of the reactance coil on the circuit carrier.

FIG. 1 shows a section of a housing 1-1 of an electronic control unit ("ECU") of an electrohydraulic brake control unit, in which a pressure-equalizing opening 1-4 is provided, by which, for example, pressure variations caused by temperature differences on the interior and exterior of the housing 1-1, together with condensation, can be prevented. The electrohydraulic brake control unit or the associated housing 1-1, by a corresponding seal, is at least protected against the entry of fluid. In order to prevent the entry of fluid through openings in the pressure-equalizing opening 1-4, the pressure-equalizing opening 1-4 incorporates an appropriate membrane for this purpose (not represented). In this example, a reactance coil 1-2 is further represented which, via the coil wires, is electrically contacted with a circuit carrier 2-1 by contact-making elements 1-3, and is moreover mechanically secured, as represented in FIG. 2, wherein, in the interests of clarity, the representation of the housing 1-1 has been omitted from FIG. 2. The configuration of the electrical and/or mechanical connection by contact-making elements 1-3 is to be understood as exemplary.

The circuit carrier 2-1 is arranged opposite the pressure-equalizing opening 1-4, by which a high degree of space utilization is achieved on the one hand, but as a result of which the electronics, in particular in the region of the pressure-equalizing opening 1-4, are particularly susceptible to interference radiation. In order to prevent any influences upon the electronics or the circuit carrier 2-4 due to interference radiation, at least one contact-making element 1-3 of the reactance coil 1-2 is arranged between the pressure-equalizing opening 1-4 and the circuit carrier 2-1, such that interference radiation can be effectively diverted. Thereby, the pressure-equalizing opening 1-4 can also be provided in a region of ESD-sensitive electronics. Alternatively, with a corresponding configuration, the coil wires can also be employed directly for screening purposes. In a comparable manner, a plurality of contact-making elements of one or more electronic components can also be arranged for the screening of interference radiation in the region of the pressure-equalizing opening 1-4.

In this example, the contact-making element 1-3 is arranged with a small clearance to the pressure-equalizing opening 1-4, and approximately centrally in relation thereto. The relative arrangement of the contact-making element 1-3 to the pressure-equalizing opening 1-4 and/or the design of the contact-making element 1-3 can deviate from the exemplary embodiment represented in FIG. 1, in consideration of the positioning of the circuit carrier 2-1, particularly with respect to the configuration of the pressure-equalizing opening 1-4, the available installation space and/or in the interests of the optimum reduction of interference radiation. The employment of a contact-making element 1-3 of an interference-suppression component, such as a reactance coil 1-2, is particularly advantageous for the achievement of protection from interference radiation, as, in the form of embodiment represented, the latter is provided in any event as a reactor for the filtering of high-frequency alternating current fractions in a power current circuit for loads of the electrohydraulic brake control unit. A load of this type includes, for example, an electric motor for the operation of a hydraulic pump of the brake control unit, by means of which pressure is generated in the brake circuits.

The contact-making element 1-3—with no resulting impairment of the pressure-equalizing functionality—can also be designed, for example, such that the surface of the pressure-equalizing opening 1-4 is partially or completely covered.

Figure 4:
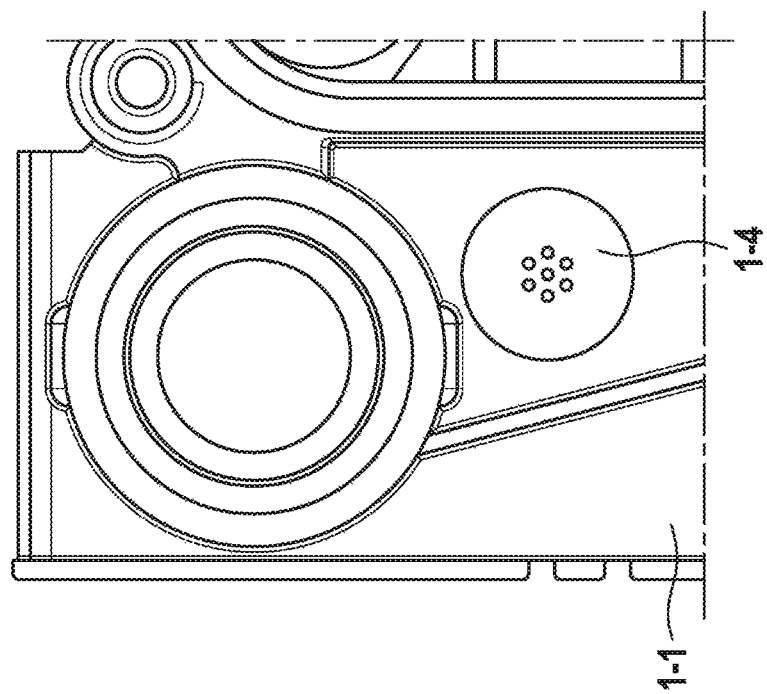
FIG. 4 shows a section of an exemplary embodiment of an outer part of the housing in the region of the pressure-equalizing opening.
Figure 3:
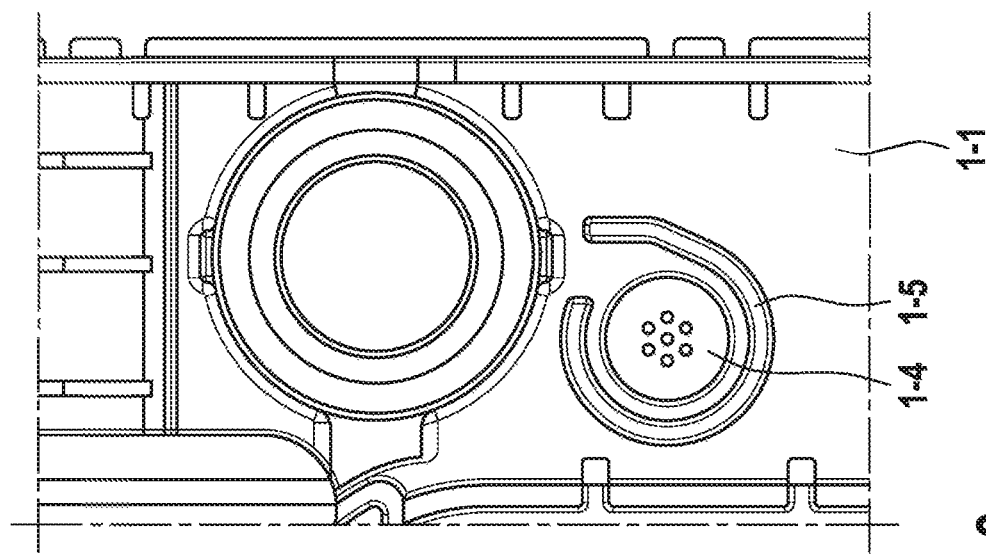
FIG. 3 shows a section of an exemplary embodiment of an inner part of the housing in the region of the pressure-equalizing opening.

In order to limit the surface area of the circuit carrier 2-1 which is potentially exposable to interference radiation as a result of the pressure-equalizing opening 1-4, and thus achieve a more effective screening by the contact-making element 1-3, the housing incorporates a molding 1-5 which at least partially encloses the pressure-equalizing opening 1-4, in the interior of the housing 1-1. In this example, the molding describes an outline which partially surrounds the pressure-equalizing opening 1-4 in a circular arrangement, but which incorporates an open region for the feedthrough of the contact-making element 1-3. For illustrative purposes, FIG. 3 shows a section of an inner part of the housing 1-1—in which the electronics are arranged—in the region of the pressure-equalizing opening 1-4, in accordance with the exemplary embodiment represented in FIG. 1. Correspondingly, FIG. 4 shows a section of an outer part of the same housing 1-1, in the region of the pressure-equalizing opening 1-4.

The invention claimed is:

1. An arrangement for protecting electronics from interference radiation, comprises:
    a housing and a circuit carrier for accommodating the electronics in an interior of the housing;
    wherein the housing defines an opening for compensation of different pressures inside and outside the housing; and
    wherein a contact-making element of an electronic component of the electronics is arranged between the opening and the circuit carrier, in such a manner that the electronics are at last partially screened from interference radiation entering the housing through the opening.

2. The arrangement as claimed in claim 1, wherein the electronic component is connected to the circuit carrier in an electrically-conductive manner by the contact-making element, wherein the electronic component is a functional constituent of a load current circuit for control of a load.

3. The arrangement as claimed in claim 1, wherein the electronic component is an interference-suppression component.

4. The arrangement as claimed in claim 1, wherein a configuration of the contact-making element and/or an arrangement of the contact-making element relative to the opening are such that, in consideration of a configuration of the opening and/or of an available installation space in the interior of the housing, a lowest possible level of interference radiation is present on the circuit carrier.

5. The arrangement as claimed in claim 1, wherein the housing includes a molding which at least partially encloses the opening, for screening of interference radiation.

6. The arrangement as claimed in claim 5, wherein the molding is disposed in the interior of the housing.

7. The arrangement as claimed in one of claim 5, wherein the molding incorporates an open region for feedthrough of the contact-making element.

* * * * *